United States Patent [19]

Hess

[11] Patent Number: 4,719,477

[45] Date of Patent: Jan. 12, 1988

[54] INTEGRATED THERMAL INK JET PRINTHEAD AND METHOD OF MANUFACTURE

[75] Inventor: Ulrich E. Hess, Corvallis, Oreg.

[73] Assignee: Hewlett-Packard Company, Palo Alto, Calif.

[21] Appl. No.: 820,754

[22] Filed: Jan. 17, 1986

[51] Int. Cl.[4] .................... G01D 15/18; H01L 21/00; B05D 5/12

[52] U.S. Cl. .......................... 346/140 R; 29/569 R; 29/577 R; 29/577 C; 29/592 R; 427/96; 427/402; 427/404; 437/60

[58] Field of Search .................... 346/76 PH, 140 R; 29/592 R, 577 C, 577 R, 583, 588, 569 R; 219/216; 427/96, 402, 404

[56] References Cited

U.S. PATENT DOCUMENTS

| | | | |
|---|---|---|---|
| 3,515,850 | 6/1970 | Cady, Jr. | 219/216 |
| 3,609,294 | 9/1971 | Cady, Jr. | 219/216 |
| 3,852,563 | 12/1974 | Bohorquez et al. | 219/216 |
| 3,953,264 | 4/1976 | Wu | 156/7 |
| 4,168,343 | 9/1979 | Arai et al. | 428/426 |
| 4,232,213 | 11/1980 | Taguchi et al. | 219/216 |
| 4,472,875 | 9/1984 | Christian et al. | 29/577 C |
| 4,535,343 | 8/1985 | Wright et al. | 346/140 R |
| 4,567,493 | 1/1986 | Ineda et al. | 346/140 R |

*Primary Examiner*—E. A. Goldberg
*Assistant Examiner*—Gerald E. Preston
*Attorney, Agent, or Firm*—William J. Bethurum

[57] ABSTRACT

This application discloses a novel thermal ink jet printhead and related integrated pulse driver circuit useful in thermal ink jet printers. This combined printhead and pulse drive integrated circuit includes a first level of metalization comprising a refractory metal which is patterned to define the lateral dimension of the printhead resistor. A passivation layer or layers are deposited atop this first level of metalization and patterned to have an opening or openings therein for receiving a second level of metalization. This second level of metalization such as aluminum may then be used for electrically interconnecting the printhead resistors to MOSFET drivers and the like which have been fabricated in the same silicon substrate which provides support for the printhead resistors. Thus, this "on-chip" driver construction enables these pulse driver transistors to be moved from external electronic circuitry to the printhead substrate.

9 Claims, 8 Drawing Figures

INTEGRATED THERMAL INK JET PRINTHEAD AND METHOD OF MANUFACTURE

TECHNICAL FIELD

This invention relates generally to thermal ink jet printing and more particularly to a novel thermal ink jet printhead with improved resistance to ink penetration and corrosion and cavitation wear. This invention is also directed to a novel integrated circuit which combines printhead interconnect metalization with MOS pulse drive circuit metalization in a unique multilevel metal MOS integrated circuit structure.

BACKGROUND ART

Thermal ink jet printing has been described in many technical publications, and one such publication relevant to this invention is the *Hewlett Packard Journal, Volume* 36, Number 5, May 1985, incorporated herein by reference.

In the manufacture of thermal ink jet printheads, it is known to provide conductive traces of aluminum over a chosen resistive material, such as tantalum-aluminum, to provide electrical lead-in conductors for conducting current pulses to the lithographically defined heater resistors in the resistive material. These conductive traces are formed by first sputtering aluminum on the surface of a layer of resistive material and thereafter defining conductive trace patterns in the aluminum using conventional photolithographic masking and etching processes.

It is also known in this art to deposit an inert refractory material such as silicon carbide or silicon nitride over the aluminum trace material and the exposed resistive material in order to provide a barrier layer between the resistive and conductive materials and the ink. This ink is stored in individual reservoirs and heated by thermal energy passing from the individually defined resistors and through the barrier layer to the ink reservoirs atop the barrier layer. The ink is highly corrosive, so it is important that the barrier layer be chemically inert and highly impervious to the ink.

In the deposition process used to form the barrier layer for the above printhead structure, rather sharply rounded contours are produced in the barrier layer material at the edges of the conductive aluminum traces. These contours take the form of rounded edges in the silicon carbide layer which first extend laterally outward over the edges of the aluminum traces and then turn back in and down in the direction of the edge of the aluminum trace at the active resistor area. Here the silicon carbide barrier material forms an intersection with another, generally flat section of silicon carbide material which is deposited directly on the resistive material. This intersection may be seen on a scanning electron microscope (SEM) as a crack in the barrier layer material which manifests itself as a weak spot or area therein. This weak spot or area will often become a source of structural and operational failure when subjected to ink penetration and to cavitation-produced wear from the collapsing ink bubble during a thermal ink jet printing operation.

In addition to the specific problem with the above prior art approach to thin film resistor substrate fabrication, it has been found that, in general, thin films and fluidic cavities in these structures which have been optimized for superior printing speed and print quality suffer from short printing resistor operating life. This is especially true when large over-energy tolerance is required. Resistor aging curves taken throughout the printing life of a thermal ink jet heater resistor reveal strongly two mechanisms which contribute to the early demise of the heater resistor. One is rapid resistor value increase due to electrochemical and mechanical interactions near the resistor terminations. The second is a slow but continuous increase of the resistance caused by the interface oxidation with the thermal standoff layer and a passivation layer. Simply stated, any mechanism contributing to the increase of the resistor value in ohms is a mechanism that leads toward the final resistor failure when its value is infinite.

DISCLOSURE OF INVENTION

Accordingly, the general purpose of this invention is to provide a new and improved thermal ink jet printhead structure and method of manufacture which, among other things, eliminates the above cracks in the barrier layer material and thus overcomes the associated problems of ink penetration through and undue cavitation wear in the barrier layer. To accomplish this purpose, the resistive heater layer for the printhead structure is formed of either polycrystalline silicon or a refractory silicide, such as tantalum silicide or titanium silicide or tungsten silicide or molybdenum silicide. Thereafter, conductive trace material of a refractory metal such as tungsten or molybdenum is deposited on the resistive heater layer. Then, a barrier layer of silicon dioxide is deposited over the conductive trace material using chemical vapor deposition (CVD) techniques and then reflowed to form smooth contours in the area of the barrier layer above the edges of the conductive trace material. Finally, an outer protective metal layer such as tantalum is sputtered on top of the reflowed silicon dioxide barrier layer material to provide even further isolation against ink penetration and cavitation-produced wear of the structure.

In a modified embodiment of my invention, the above novel printhead structure is integrated with pulse drive circuitry, such as metal-oxide-silicon-field-effect transistor (MOSFET) drivers, in a novel multi-level metal integrated circuit. In this integrated circuit, a first level of metalization comprises a refractory metal such as tungsten, titanium, tantalum or molybdenum which is patterned to define one dimension of a printhead resistor in a resistive layer on which it lies. A passivation layer or layers are deposited on the first level of metalization and selectively etched to provide an opening or openings therein. Then, a second level of metalization, such as tantalum and aluminum, is deposited in this opening or openings to make electrical contact with the first level of metalization and thereby provide an interconnect path between the printhead resistor and MOSFET pulse drive circuitry and the like. Thus, MOS or even bipolar transistors or other semiconductor devices may be fabricated in one area of a silicon substrate and printhead resistors defined in another area atop the surface of the same silicon substrate. Then, using the above multi-level interconnect scheme, aluminum interconnects from the outputs of these transistors may be connected to the refractory metal connections which lead into the various printhead resistors in novel MOSFET driver-ink jet printhead integrated circuit construction.

The advantages and novel features of the above summarized printhead structure and integrated circuit will become better understood and appreciated with reference to the following description of the accompanying drawings.

BEST MODE FOR CARRYING OUT THE INVENTION

Figure 1:
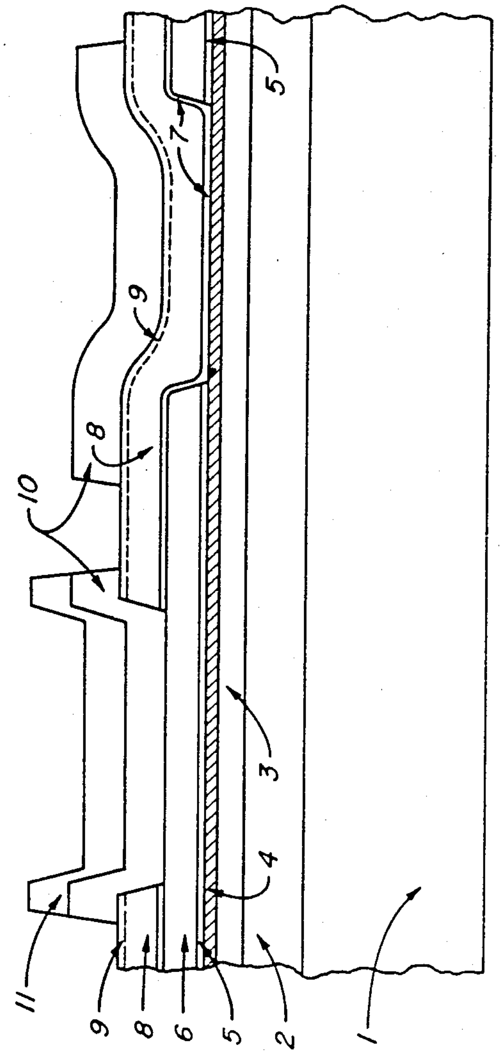
FIG. 1 is a schematic cross section view of the printhead device structure according to a preferred embodiment of the invention.

Referring now to FIG. 1, the printhead device structure according to a preferred embodiment of the invention will be initially described by identifying the various layers therein. Then, with reference to FIGS. 2A through 2G, the various process steps utilized in achieving this device structure will be described in more detail.

In FIG. 1, the printhead substrate starting material 1 is silicon and has a surface thermal isolation layer 2 of silicon dioxide thereon. A silicon nitride layer 3 is deposited on the surface of the silicon dioxide layer 2, and then a resistive layer 4 of tantalum silicide is deposited on the surface of the silicon nitride layer 3 to provide the layer material for the resistive heater elements in a geometry to be further described.

The next two layers 5 and 6 are both tungsten, and a layer of silicon nitride 7 is formed on the top surface of the second and thicker layer 6 of tungsten and photolithographically defined in the geometry shown to determine the lateral extent of the heater resistor. Next, a layer 8 of phosphosilicate glass is formed atop the silicon nitride layer 7, and then another layer of more lightly doped phosphorous glass 9 is formed on the previous glass layer 8. The dielectric passivation layers 7, 8 and 9 are now appropriately etched using a dry etchant such as $SF_6$ and argon.

A layer 10 of tantalum is deposited atop the glass layer 9 and then a further conductive layer 11 of aluminum is deposited onto the tantalum layer 10. These interconnection layers 10 and 11 are subsequently etched to define the two surface barriers for the heater resistor and the interconnect pad, respectively, on the right and left hand sides of the device structure. These conductive layers 10 and 11 on the left hand side of FIG. 1 serve as an electrical interconnection to other electronics, such as pulse drive circuitry for the heater resistors designed in layer 4. Thus, the heater resistors in FIG. 1 may be electrically connected by way of tungsten layers 5 and 6 and through the conductors 10 and 11 on the interconnect pad side of the structure in a metal-oxide-silicon (MOS)-printhead integrated circuit of novel construction. For example, the metal contact 11 may be extended in the form of a strip of metallization to the output or drain terminal of a MOS driver field-effect transistor which operates as an output device of a particular MOS pulse drive circuit.

Figures 2A, 2B, 2C, 2D:
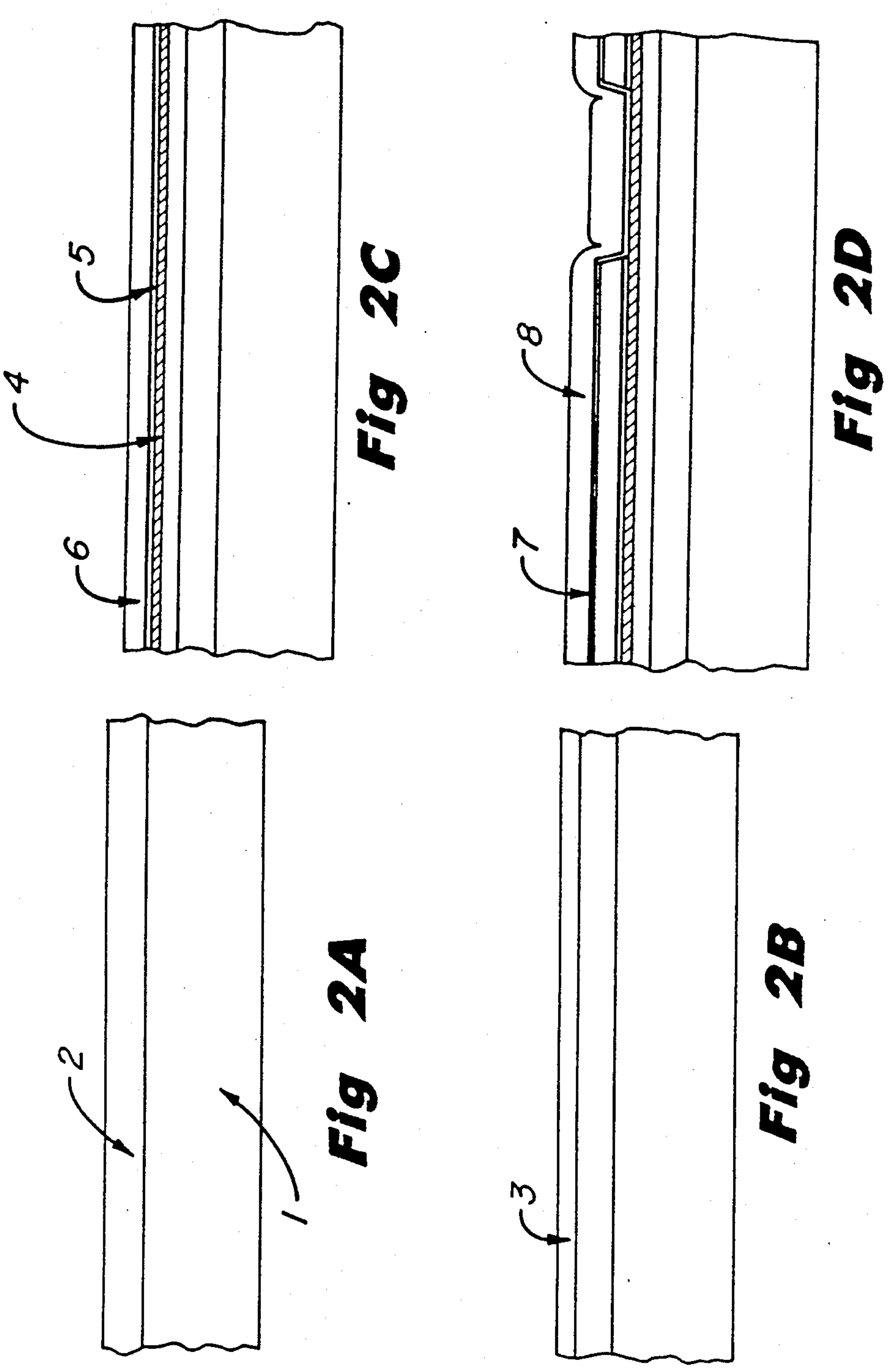
FIGS. 2A through 2G illustrate schematically the processing sequence used in the manufacture of the printhead structures in FIG. 1.

Referring now to FIGS. 2A through 2G, the silicon substrate 1 will typically be 15 to 25 mils in thickness and of a resistivity of about 20 ohm centimeters and will have a layer 2 of thermal silicon dioxide of about 1.6 microns in thickness thereon as shown in FIG. 2A.

In FIG. 2B there is shown a thin 0.1 micron silicon nitride, $Si_3N_4$, layer 3 which is deposited on the $SiO_2$ layer 2 by low pressure chemical vapor deposition (LPCVD). This and other similar processes referred to herein are generally well known in the semiconductor processing arts and are disclosed for example by A. B. Glaser, et al. in a book entitled *Integrated Circuit Engineering Design, Fabrication and Application,* Addison-Wesley, 1979 at page 237, incorporated herein by reference.

Next, as shown in FIG. 2C, a resistive layer 4 is formed on the $Si_3N_4$ layer 3 by sputtering tantalum silicide to a thickness of between 500 and 1000 angstroms, and this step is followed by the sputtering of a layer 5 of tungsten to a thickness of about 250 angstroms. Next, a thicker, lower resistivity tungsten layer 6 is grown on the thin tungsten layer 5 to a thickness of about 0.5 microns by using chemical vapor deposition (CVD). Then, after etching the conductive and resistive layers 4,5, and 6 previously deposited and in the geometry shown, plasma enhanced chemical vapor deposition (PECVD) is used to deposit a layer 7 of silicon nitride, $SiN_xH_y$, of approximately 1000 angstroms in thickness on the surface of the tungsten layer 6 as shown in FIG. 2D. These PECVD processes are known to those skilled in the semiconductor processing arts and are described, for example, by R. F. Bunshah et al in an book entitled *Deposition Technologies for Films and Coatings, Noyes Publications,* 1982, page 376 et seq, incorporated herein by reference.

Figure 2E:
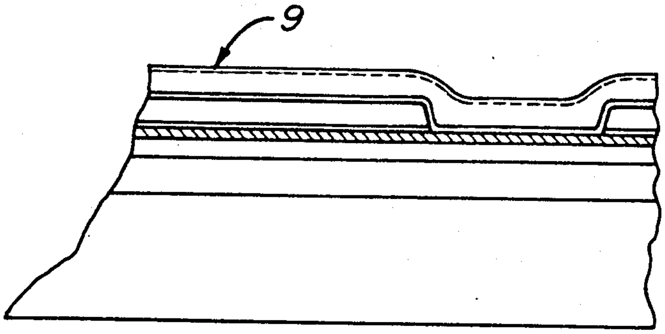

In the next step shown in FIG. 2D, a layer 8 of phosphorous doped glass, $SiO_2$, doped to approximately 8 percent phosphorous content is formed by chemical vapor deposition (CVD) in the contour shown, whereafter the structure is annealed for approximately 15 minutes at 1000° C. to stabilize a tantalum silicide resistive layer 4 and to reflow the phosphorous doped or phosphosilicate glass (PSG) over the resistor terminations. Then, a layer 9 of phosphosilicate glass is formed on the surface of layer 8 to a thickness of about 2000 angstroms and doped at 4 percent phosphorous content. This PSG layer 9 is shown in FIG. 2E and serves to inhibit the formation of phosphoric acid which could attack subsequently applied aluminum final conductors.

Figure 2F:
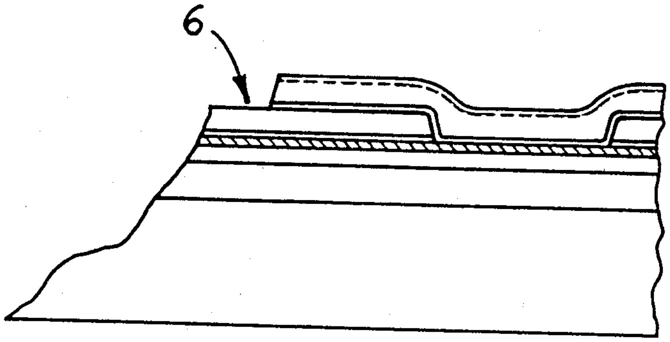
Figure 2G:
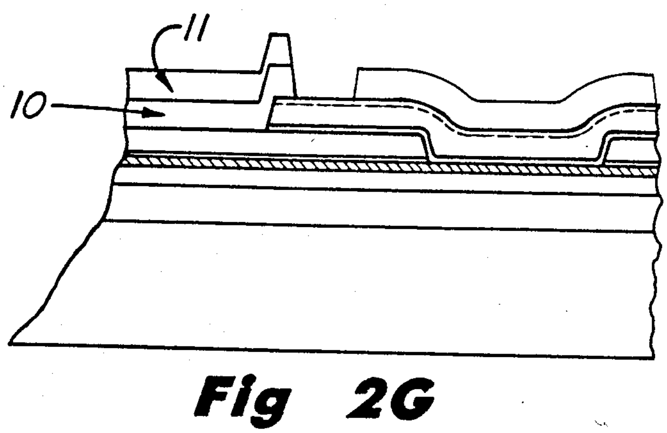

At this point in the process, the triple layer passivation (7, 8 and 9) is dry etched down to the CVD tungsten layer as shown at reference number 6 in FIG. 2F. Then, cavitation barrier 10 of tantalum and the final aluminum interconnect layer 11 are sputtered respectively to thicknesses of about 0.6 microns and 0.4 microns. These steps are illustrated schematically in FIG. 2G and complete the resultant structure which corresponds identically to the composite integrated circuit structure of FIG. 1. The pad or interconnect layers 10 and 11 are patterned by wet chemical etching techniques to define the device geometry shown in FIG. 2G.

Thus, there has been described a novel printhead device structure and method of manufacture wherein refractory local interconnect metalization, to wit: tungsten, allows high temperature reflow of the subsequently deposited phosphorous doped silicon (PSG) glass, thereby sealing the resistor electrode terminations. Silicon nitride films are formed above and below the resistor film and thus serve as effective oxidation barriers while the overlying silicon nitride serves as an additional moisture barrier. The refractory silicide resistor film exhibits superior high temperature stability as well as the ability to anneal the structure up to 1100° C. before applying the interconnect metalization.

The above structure and its silicide layer are compatible with integrated circuit processing and allow the building of the resistor, conductor and passivation layers after the resistor logic and drive transistors have been fabricated. One very significant advantage of this invention is the fact that a single common semiconductor substrate such as silicon may be used for the fabrication of MOS or bipolar driver transistors in one area of the substrate and for the fabrication of thermal ink jet printhead resistors in another area of the substrate. Then these devices may be interconnected using the above described multi-level metal interconnect scheme.

There are many technical references on the per se use of silicides as the gate level interconnect material for MOS devices, and such interconnect techniques were discussed in detail at the 1985 Semicon/East conference in Boston, Mass. in September of 1985. In addition, for further reference to certain other applications, treatment, and deposition of silicides, tungsten metalization and phosphosilicate glass (PSG), reference may be made to the following technical articles, all of which are incorporated herein by reference:

TECHNICAL REFERENCES

Tungsten Metalization

N. Susa, S. Ando, S. Adachi, *Journal of the Electrochemical Society,* Vol. 132, No. 9, p. 2245

M. L. Green, R. A. Levy, *Journal of the Electrochemical Society,* Vol. 132, No. 5, p. 1243 *Silicides*

T. P. Chow, W. Katz, R. Goehner, G. Smith, *Journal of the Electrochemical Society,* Vol. 132, No. 8, p. 1914

M. Tamielian, S. Blackstone, *Journal of the Electrochemical Society,* Vol. 132, No. 6, p. 1487

R. A. Levy, P. K. Gallagher, *Journal of the Electrochemical Society,* Vol. 132, No. 8, p. 1986

S. P. Murarka, "*Silicides for VLSI Applications*", Academic Press, NY (1983)

T. P. Chow, *IEEE Electron Devices,* ED-30, 1480 (1983) *Phosphosilicate Glass (PSG)*

K. Nassau, R. A. Levy, D. L. Chadwick, *Journal of the Electrochemical Society,* Vol. 132, No. 2, p.409

The following table lists the formation method, thickness and physical properties of the various layers of my preferred embodiment in accordance with the best mode known to me at the present time for practicing the invention.

TABLE OF THIN-FILM MATERIALS AND PROPERTIES

| FILM | FORMATION METHOD | THICKNESS | PHYSICAL PROPERTY |
|---|---|---|---|
| SiO2 | thermal oxidation | 16000 A | index of refraction 1.46 |
| Si3N4 | LPCVD | 1000 A | index of refraction 2.01 |
| TaSix | co-sputter/sinter | ~750 A | sheet resistance 37 ohm/square |
| W | sputter | 250 A | sheet resistance 8 ohm/square |
| W | LPCVD | 5000 A | sheet resistance 0.14 ohm/square |
| SiNxHy | PECVD | 1000 A | index of refraction 2.00 |
| SiO2/8% P | CVD | 8000 A | index of refraction ~1.46 |
| SiO2/4% P | CVD | 2000 A | index of refraction ~1.46 |
| Ta | sputter | 6000 A | sheet resistance 2.7 ohm/square |
| Al/4% Cu | sputter | 4000 A | sheet resistance 0.12 ohm/square |

I claim:

1. A process for fabricating a printhead structure for a thermal ink jet printhead which includes the steps of:

a. providing an insulating substrate layer, b. depositing a layer of resistive material on the surface of said substrate layer and consisting of either polycrystalline silicon or a chosen refractory silicide selected from the group of tantalum silicide, titanium silicide, tungsten silicide and molybdenum silicide, c. forming a chosen refractory metal conductive pattern atop said resistive material and having an opening therein defining one dimension of a thermal ink jet resistor and for receiving current pulses when heating said resistive material during an ink jet printing operation, d. depositing a layer of silicon dioxide atop said conductive trace material, and thereafter e. reflowing said silicon dioxide layer in order to reshape the contours thereof and enable the surface contour of said silicon dioxide layer to more closely replicate the conductive trace material over which it is deposited.

2. The process defined in claim 1 which further includes the steps of depositing a refactory metal layer on the surface of said silicon dioxide layer and to a predetermined thickness.

3. The process defined in claim 1 wherein thin protective insulating layers of silicon nitride are formed on both sides of said conductive trace material in order to provide additional shielding of said resistive layer from oxidation, cavitation-produced wear and ink penetration during an ink jet printing operation.

4. A process for fabricating an integrated thermal ink jet and driver circuit including the steps of:

a. providing a chosen resistive material on a printhead substrate, b. forming a layer of refractory metal on the surface of said resistive material and having an opening therein defining one dimension of a thermal ink jet resistor, c. providing a passivation layer or layers on the surface of said refractory metal and having an opening therein exposing a surface area of said refractory metal, d. reflowing said passivation layer or layers at a chosen elevated temperature to provide smooth contours therein which are compatible with multi-level metal integrated circuit connections, and e. depositing interconnect metallization in said opening to make electrical contact with said refractory metal, whereby MOS driver circuitry and the like may be fabricated on a common substrate with said thermal ink jet heater resistors in a monolithic multi-level metal integrated circuit arrangement especially well suited for multi-level metal interconnections.

5. The process defined in claim 4 wherein said refractory metal is selected from the group consisting of tungsten and tantalum and titanium and molybdenum.

6. The process defined in claim 5 wherein said resistive material is selected from the group consisting of a refractory silicide and polycrystalline silicon.

7. The process defined in claim 4 which further includes heating said surface passivation layer or layers at a chosen elevated temperature to provide smooth contours therein which are compatible with multi-level metal integrated circuit connections.

8. The process defined in claim 7 which further includes depositing a barrier layer metal on the surface of said passivation layer or layers.

9. An integrated circuit wherein driver circuitry and printhead resistor interconnect circuitry are fabricated on a common substrate, including:

a. a substrate having a layer of resistive material thereon, said resistive material being selected from the group consisting of polycrystalline silicon and a refractory metal silicide, b. a layer of refractory metal disposed on said resistive material and having an opening therein defining one dimension of a thermal ink jet resistor, said refractory metal being selected from the group consisting of tungsten and titanium and tantalum and molybdenum, c. a passivation layer or layers disposed on the surface of said refractory metal and having an opening therein exposing a surface area of said refractory metal, d. driver interconnect metallization disposed in said opening in said passivation layer and in electrical contact with said refractory metal, whereby said interconnect metallization and said refractory metal may be formed in immediately adjacent layers in an MOS multi-level metal integrated circuit, and e. a metal barrier layer disposed on the surface of said passivation layer or layers and above an ink jet resistor to provide enhanced insulation from ink which is disposed above said thermal ink jet resistor, said metal barrier layer is tantalum, said interconnect metallization is aluminum, and one of said passivation layers is phosphorous doped glass.

* * * * *